US005448598A

United States Patent [19]
Yousefi et al.

[11] Patent Number: 5,448,598
[45] Date of Patent: Sep. 5, 1995

[54] ANALOG PLL CLOCK RECOVERY CIRCUIT AND A LAN TRANSCEIVER EMPLOYING THE SAME

[75] Inventors: Nariman Yousefi, Irvine; Benjamin E. Nise, Laguna Niguel; Kelly P. McClellan, Irvine, all of Calif.

[73] Assignee: Standard Microsystems Corporation, Hauppauge, N.Y.

[21] Appl. No.: 88,008

[22] Filed: Jul. 6, 1993

[51] Int. Cl.⁶ .................... H04L 7/00; H04L 25/36; H04L 25/40; H03D 3/24
[52] U.S. Cl. ................................ 375/376; 375/373; 331/17; 327/156; 327/299
[58] Field of Search .................. 375/81, 120; 307/262, 307/269; 331/14, 17, 25; 328/133, 155, 71, 63

[56] References Cited

U.S. PATENT DOCUMENTS

| | | |
|---|---|---|
| 3,614,635 | 10/1971 | LaPine . |
| 4,464,771 | 8/1984 | Sorensen .................. 375/120 |
| 4,644,420 | 2/1987 | Buchan . |
| 4,926,141 | 5/1990 | Herold et al. ............... 331/17 |
| 5,036,298 | 7/1991 | Bulzachelli . |
| 5,121,085 | 6/1992 | Brown ........................ 331/17 |
| 5,128,632 | 7/1992 | Erhart et al. ............... 331/17 |
| 5,173,664 | 12/1992 | Petersen et al. ........... 375/120 |
| 5,208,546 | 5/1993 | Nagaraj et al. ............. 307/262 |
| 5,313,499 | 5/1994 | Coburn ...................... 375/120 |

OTHER PUBLICATIONS

Devito, et al., "A 52 Mhz and 155 MHz Clock-Recovery PLL", Analog Devices Semiconductor Division, Wilmington, Mass., DIGEST OF TECHNICAL PAPERS, IEEE International Solid-State Ciruits Conference, 1991.

Lee, et al. "A 155 MHz Clock Recovery Delay and Phase-Locked Loop", Analog Devices Semiconductor Division, Wilmington, Mass., DIGEST OF TECHNICAL PAPERS, IEEE International Solid-State Ciruits Conference, 1992.

Primary Examiner—Stephen Chin
Assistant Examiner—Timothy J. May
Attorney, Agent, or Firm—Hopgood, Calimafde, Kalil & Judlowe

[57] ABSTRACT

A VSLI transceiver chip incorporating an improved analog PLL circuit for recovering a digital clock signal from a digital data signal having pulse widths which may vary during each data cycle. The analog PLL clock recovery circuit comprises a phase detector, a gain control circuit, a variable current charge pump, a loop filter and a variable frequency oscillator. The phase detection means for detecting, during each data cycle, the phase error between the digital data signal and recovered digital clock signal, and produces first end second digital control pulse signals in response to the detection of the phase error. The gain control means produces third and fourth digital control pulse signals during each data cycle. The value of the third and fourth control pulse signals during each data cycle depends on the value of the digital data signal, the value of the recovered clock signal, and the value of the second digital control pulse signal during the data cycle, and the change in value of the third and fourth control pulse signals is responsive to the change in the value of the recovered digital clock signal. The variable current charge pump receives the first and second digital control pulse signals. The recovered digital clock signal is produced by variable frequency oscillator, having a clock frequency proportional to the produced analog control signal.

12 Claims, 9 Drawing Sheets

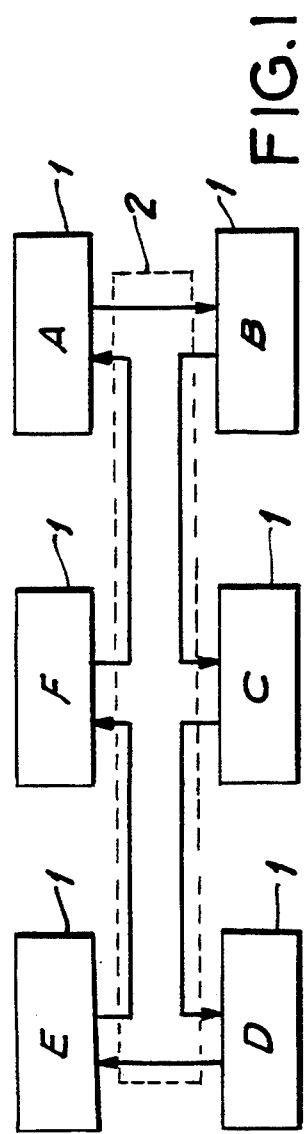
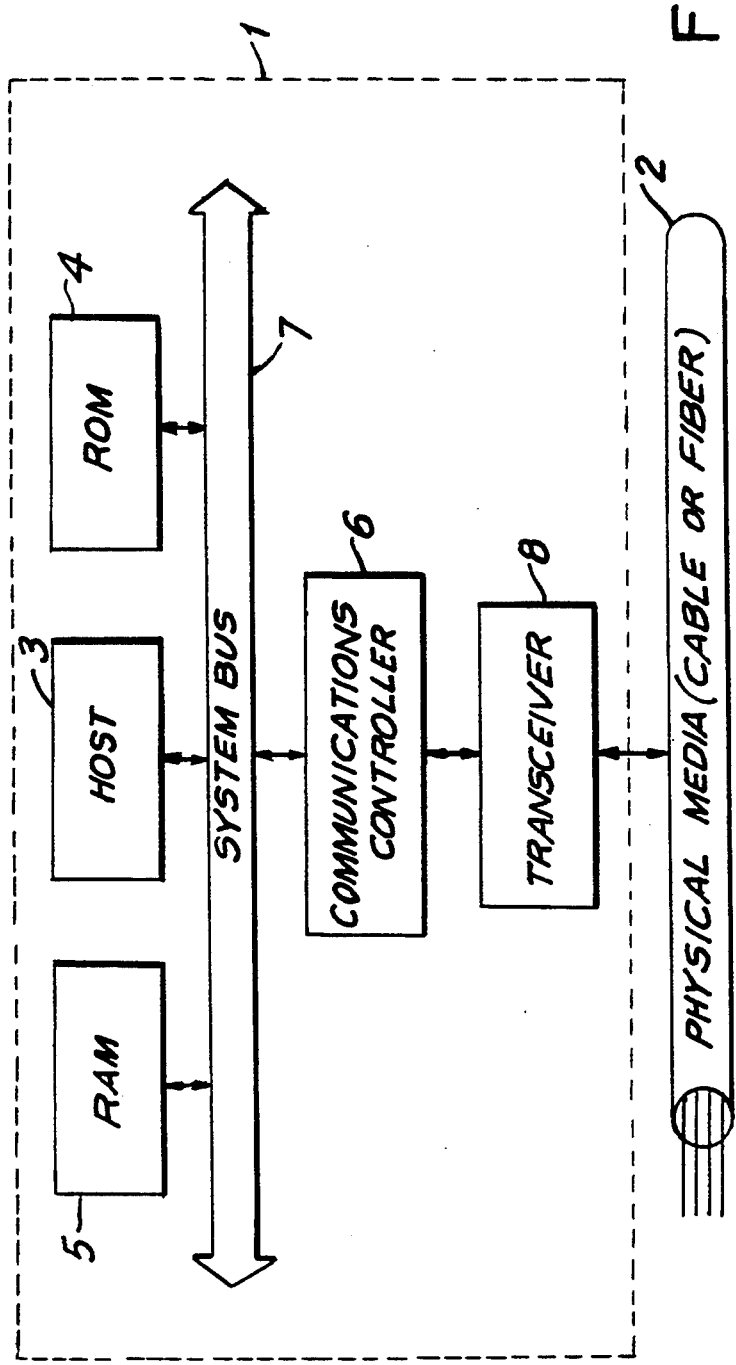

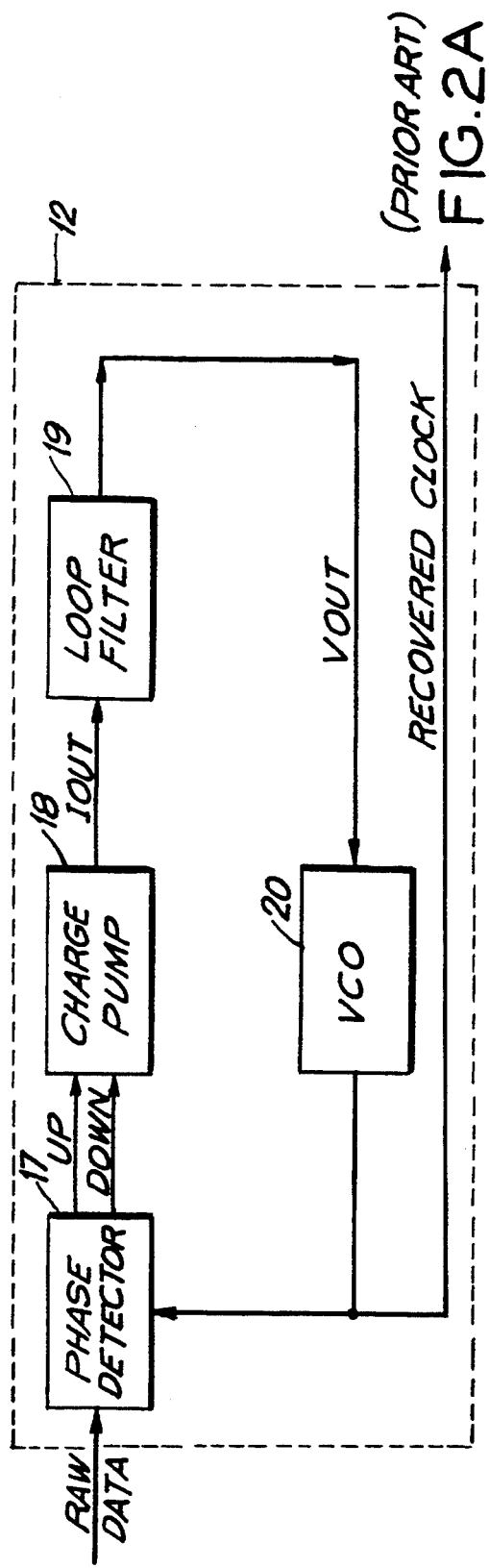
(PRIOR ART) FIG. 2A
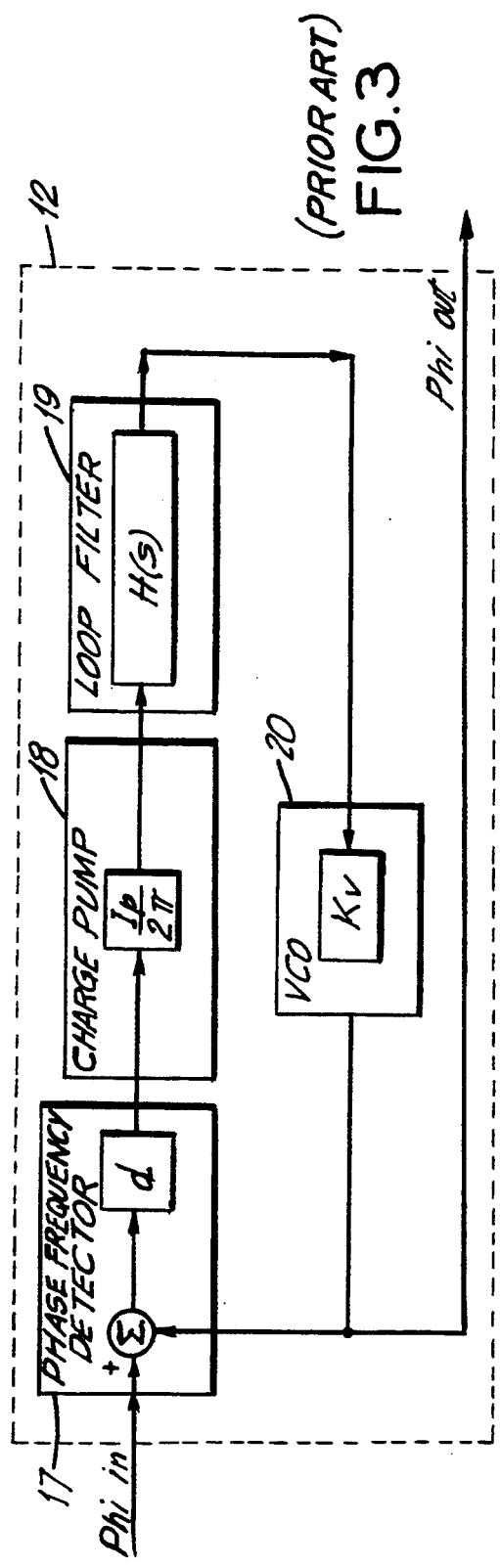
(PRIOR ART) FIG. 3

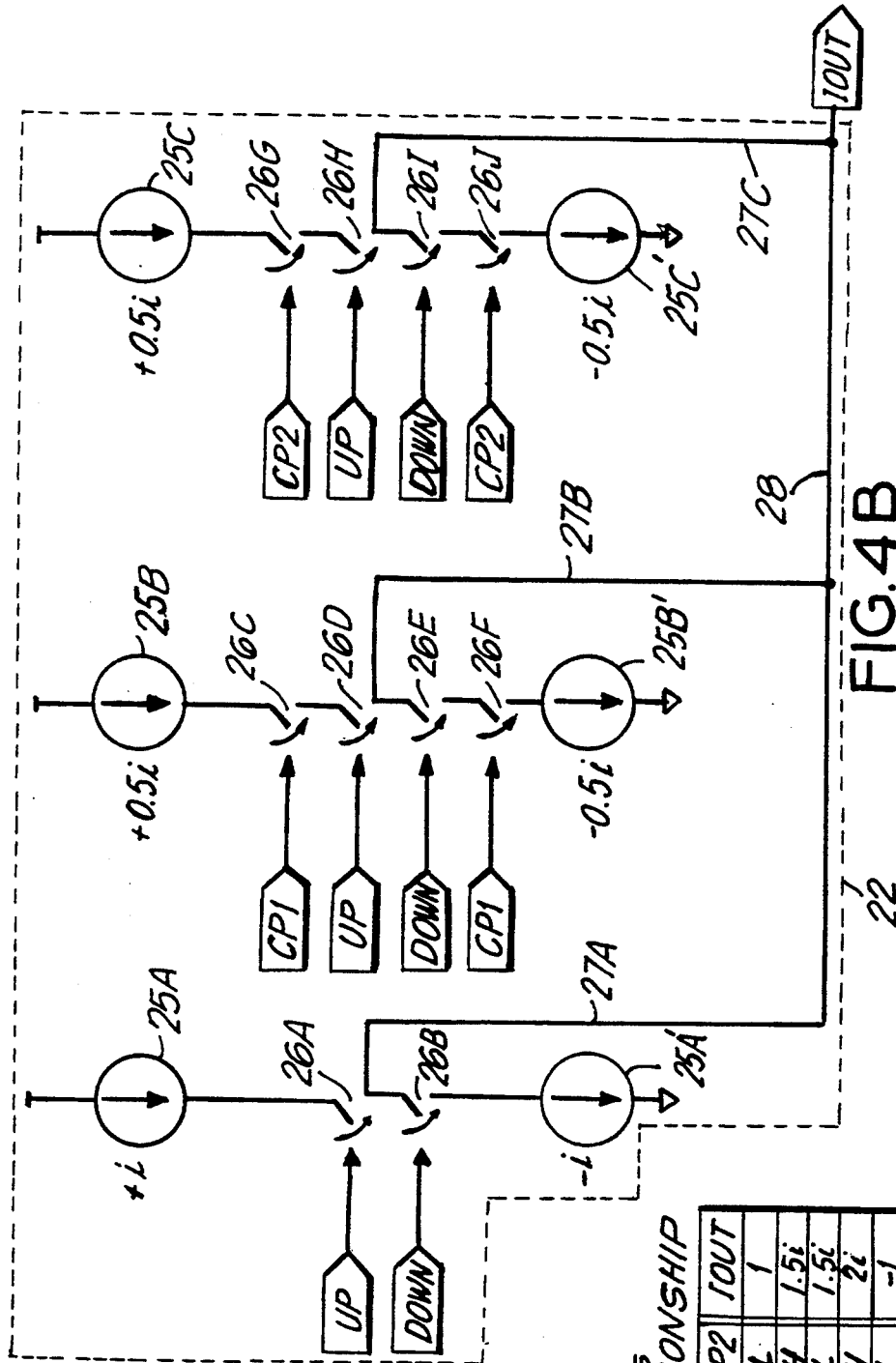

ANALOG PLL CLOCK RECOVERY CIRCUIT AND A LAN TRANSCEIVER EMPLOYING THE SAME

BACKGROUND OF INVENTION

1. Field of Invention

The present invention relates generally to a novel analog phase locked loop (PLL) clock recovery circuit having particular performance advantages when used in the acquisition of data signals transmitted over token-ring local area networks.

2. Brief Description of the Prior Art

Local-area networks (LAN) are communication systems for enabling data-processing devices, such as computer workstations, to communicate with each other through a communication (e.g. transmission) media. Data-processing devices in such networks are typically referred to as nodes or stations, and many such stations are likely to be relatively autonomous requiring communication with other stations only occasionally. Other stations may require more frequent communication, and the amount of communication required by a particular station can vary from time to time. In many local area network, stations can be easily added to, removed from, and moved from place to place within the network.

While there are numerous local area networks presently known, they can be classified into two general types. The first type of network is referred to as a "centralized network" which is characterized by the requirement of a centralized network controller which implements the network protocol. The second type of local area network is referred to as a "distributed network" which does not require a centralized network controller, and instead provides each station within the network with a communication controller having a medium access control (MAC) unit that locally implements the network protocol within each communication controller.

In a distributed local area network, packet switching is a technique commonly employed to dynamically allocate the communication medium of the network among multiple communicating stations. According to this technique, messages to be communicated between stations are partitioned (by the transmitting station's processor) into packets, having a fixed maximum size. The packets are then ascribed a station (i.e. source) identifier. The packets are then placed on the communication medium by the station's data communication controller. Such packets are then sensed and selectively processed by the data communication controller of the destination station in the network.

To more fully appreciate the problems associated with distributed local-area-networks, reference is made to FIGS. 1 through 3. In FIG. 1, a distributed local area-network is shown comprising a plurality of stations 1 (i.e. nodes A through F) which are operably associated with a communication medium 2, such a cable. While a number of network configurations are possible, a token-ring network configuration is schematically illustrated for purposes of illustration. As shown in FIG. 1A, each station generally comprises a host processor (e.g., CPU) 3, a program memory 4, a system memory 5, a communication controller 6, a system bus 7, and a transceiver 8. The processor, program memory and system memory are each associated with a system bus 7, and the system bus, in turn, is interfaced with data communication controller 6, as shown. The data communication controller is interfaced with the communication medium by way of the transceiver. Typically, the transceiver is suitably adapted to the particular characteristics of the communication medium 2 being employed in the network.

In general, the data communication controller is usually integrated into a system architecture and software environment by providing a means for supporting two independent data queues in software: a transmit queue and a receive queue. Each queue is associated with a process, namely, the transmit process and the receive process of the low-level software communications driver. The transmit and receive queues are managed by software in system memory and eventually meet the communication controller. The interface between the queues and the communications controller determines the behavior of the queues during the addition of receive elements and removal of transmit elements. Management of the transmit and receive queue elements at the level of the data communication controller can be achieved in a variety of ways. One way in particular is described in copending Application Serial No. 07/965,145 entitled "METHOD AND APPARATUS FOR BUFFERING DATA WITHIN STATIONS OF A COMMUNICATION NETWORK" filed Oct. 22, 1992, which is incorporated herein by reference.

In distributed communication networks utilizing multiple layer token-passing communication protocols, such as the IEEE 802.5 standard, data packets must be transmitted around the ring of stations shown in FIG. 1. In accordance with the IEEE 802.5 standard, data packets are always being transmitted and received within the token-ring network. During this process a token-packet is passed from one station to another station in order to transfer the right of a station to initiate the transmission of packets to a destination station in the token-ring network. In a physical and data-flow sense, each station acts as a single repeater in a ring of repeaters. To provide improved synchronization among the stations in the network, each station is required to first recover the phase and frequency of the clock from the data signal transmitted from the previous station, and then use the recovered clock to time the transmission of data to the next station in the token-ring network. Only one station (i.e. the "active" monitor) on the ring uses its own local crystal oscillator to time its own data transmission. Thus, it is this station whose clock is used to time all data packet transmissions within the token-ring network.

As shown in FIG. 2, transceiver 8 at each station in a token-ring network comprises a number of components, namely: a receiver amplifier 10 for amplifying analog data signal received from cable 2; a digitizer 11 for converting the amplified analog data signal into a digital data signal suitable for digital signal processing; a phase locked loop (PLL) clock recovery circuit 12 for recovering from the digital data signal, the clock signal having edge transitions corresponding to the edge transitions of the incoming digital data signal; a flip-flop circuit 13 for separating retimed binary data $D_2$ from raw binary data stream $D_1$; and a transmitter 14 for transmitting data on cable 2. As a result of time required to perform the data processing operations in the data communication controller at each station, each station introduces an inherent station delay between the receiver 10 and transmitter 14. For the purposes of analysis, this station delay can be modeled as a first-in-first-out buffer (FIFO) 15 as shown in FIG. 2.

As shown in FIG. 2A, conventional PLL clock recovery circuit 12 comprises a number of subcomponents, namely: a phase detector 17 for detecting the phase deviation (i.e. error) between each (i) incoming data edge of the (raw) digital data signal $D_1$ and (ii) incoming clock edge in the recovered clock signal clock, and producing a control signal which is proportional to the detected phase error; a charge pump 18 for producing charge proportional to the phase error detected by the phase detector; a loop filter 19 for integrating the charge pump output and compensate for the dynamics of the PLL, and producing a control voltage; and a voltage controlled oscillator 20 coupled to the phase detector 17, for producing a phase locked recovered clock signal in response to the voltage produced by the loop filter. In general, the function of the loop filter is to permit fast locking of the recovered clock signal while avoiding frequency instability problems during steady state operation.

When such prior art PLL clock recovery circuits are used in the station transceivers of a token-ring local area network, a serious problem arises due to the variable data patterns (i.e. density) typically transmitted over the token-ring network. The problem, known as "phase slope accumulation" can be more readily appreciated with reference to the token-ring network of FIG. 1 and the transfer function diagram of the PLL clock recovery circuit, shown in FIG. 2. By definition, accumulated phase slope (APS) is the phenomena where the first derivative of the data-dependent, phase step response in a chain of PLL clock recovery circuits, reaches a certain theoretical limit, namely:

$$APS = \lim\left(\frac{d\phi}{dt}\right) = \frac{K\phi_s}{1 + K\tau} \quad (1)$$

where $\phi_s$ is the phase step magnitude due to cable group delay characteristics, K is the open loop gain of each PLL, and $\tau$ is the station delay of each PLL clock recovery circuit. With reference to FIG. 3A, the open loop gain K in the PLL circuit can be approximated by the expression:

$$K = \frac{I_p K_v R d}{2\pi} \quad (2)$$

where $I_p$ is the charge pump current, k is the VCO gain, R is the loop filter resistor, and d is the data density measured as the number of clock cycles between adjacent data edges.

Accumulated phase slope in a token-ring network results in a corresponding phase offset between incoming data and clock edges, and severely limits the performance of each PLL clock recovery circuit in the network. A high degree of phase offset between incoming data and clock edges can either shift the sampling clock of the PLL data recovery circuit (12, 13) to a less than optimal sampling point, or cause the PLL clock recovery circuit 12 to loose its lock onto the recovered clock signal. The amount of phase offset caused by accumulated phase slope can be approximated by the expression:

$$\phi_{os} = \frac{\lim\left(\frac{d\phi}{dt}\right)}{K} \quad (3)$$

As can be seen from expression (1), phase slope accumulation (APS) can be limited by a judicious choice of open loop gain K. However, a lower open loop gain will increase the time it takes for the PLL clock recovery circuit to track a change in phase error between the incoming data and clock edges. For a single PLL clock recovery circuit, a trade-off between open loop gain and the rise time of the phase step response can usually be made with satisfactory results. However, in token-ring networks, each PLL clock recovery circuit must track raw digital data signals having data cycle widths which can vary from 2 to 1. As the open loop gain of a conventional charge-pump PLL clock recovery circuit is proportional to the data density d of the incoming data pattern, the gain of each PLL clock recovery circuit in the token-ring network will also vary from 2 to 1. However, in the case of a token-ring network, the trade-offs which can be made for a single PLL clock recovery circuit no longer hold. Therefore, when incoming data patterns characterized by high data cycle widths are received at a station transceiver, the performance of prior art PLL clock recovery circuit suffers due to an inability of prior art PLL clock recovery circuits to track the accumulated phase slope present in the raw data signal. Also, when data patterns characterized by low data cycle widths are received, prior art PLL clock recovery circuits generates excessive phase slope in the recovered clock signal.

Thus, there is a great need in the data communication art for an improved PLL clock recovery circuit that can be integrated within local area network transceiver in order to overcome the shortcomings and drawbacks of prior art techniques.

OBJECTS AND SUMMARY OF THE INVENTION

Accordingly, it is a primary object of the present invention to provide an improved phase-locked loop (PLL) clock recovery circuit that can be used to reliably recover the clock signal from variable data patterns transmitted over local area networks plagued by accumulated phase slope.

A further object of the present invention is to provide a PLL clock recovery circuit, in which the average gain thereof remains substantially constant over the range of data cycle lengths required for token-ring local area networks.

A further object of the present invention is to provide such a gain-controlled PLL clock recovery circuit, in which both phase slope accumulation and phase step magnitude are substantially minimized.

A further object of the present invention is to provide PLL clock recovery circuit having improved response characteristics.

A further object of the present invention is to provide an integrated circuit (IC) transceiver chip employing the gain controlled PLL clock recovery circuit of the present invention so that the transceiver is capable of reliably recovering the clock and data from a received data signal, and thereafter retransmitting the same over the communication medium of a token-ring local area network.

A further object of the present invention is to provide a local area communication network having a plurality of stations each of which has a transceiver which incorporates the novel analog PLL clock recovery circuit of the present invention.

These and other objects of the present invention will become apparent hereinafter.

BRIEF DESCRIPTION OF THE DRAWINGS

For a more complete understanding of the present invention, the Detailed Description of the Illustrative Embodiment should be read in conjunction with the following drawings, in which:

FIG. 1 is a schematic representation of a local area communication network arranged in a token-ring configuration;

FIG. 1A is a block diagram of a typical station in the local area communication network of in FIG. 1;

FIG. 2A is a block functional diagram of a prior art PLL clock recovery circuit used in the prior art data transceiver of FIG. 2;

FIG. 3 is a transfer function diagram of the prior art PLL clock recovery circuit shown in FIG. 2A;

FIG. 4B is a schematic diagram of the variable current charge pump circuitry employed in the PLL clock recovery circuit of the illustrative embodiment of the present invention;

FIG. 4C is a table illustrating the relationship between output current (IOUT) produced by the variable-current charge pump circuitry shown in FIG. 4B, and the digital control pulses produced by the phase detector and the gain control circuitry;

DETAILED DESCRIPTION OF THE ILLUSTRATIVE EMBODIMENT OF THE PRESENT INVENTION

Figure 4:
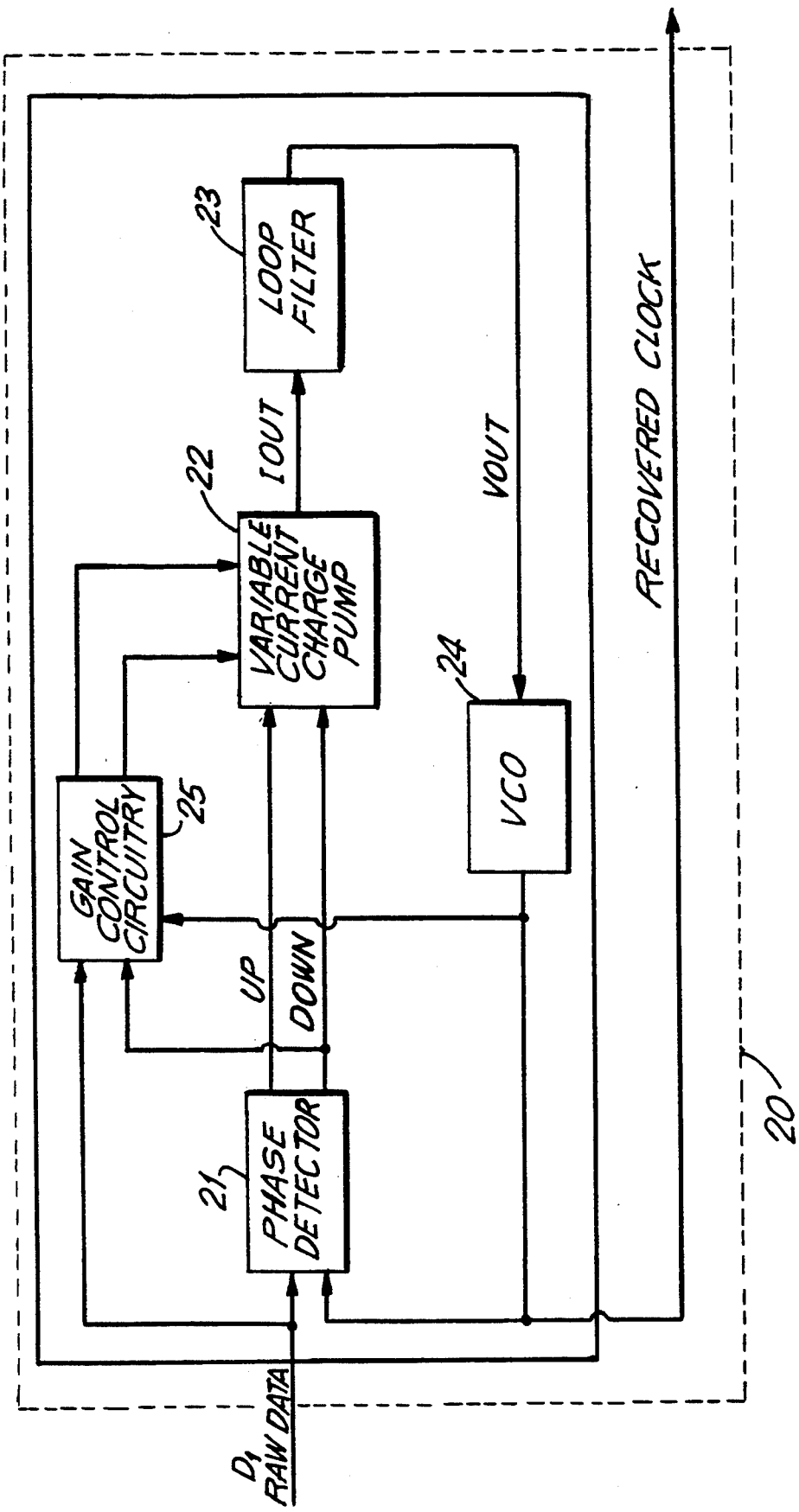
FIG. 4 is a block functional diagram of the analog PLL clock recovery circuit of the present invention.
Figure 5:
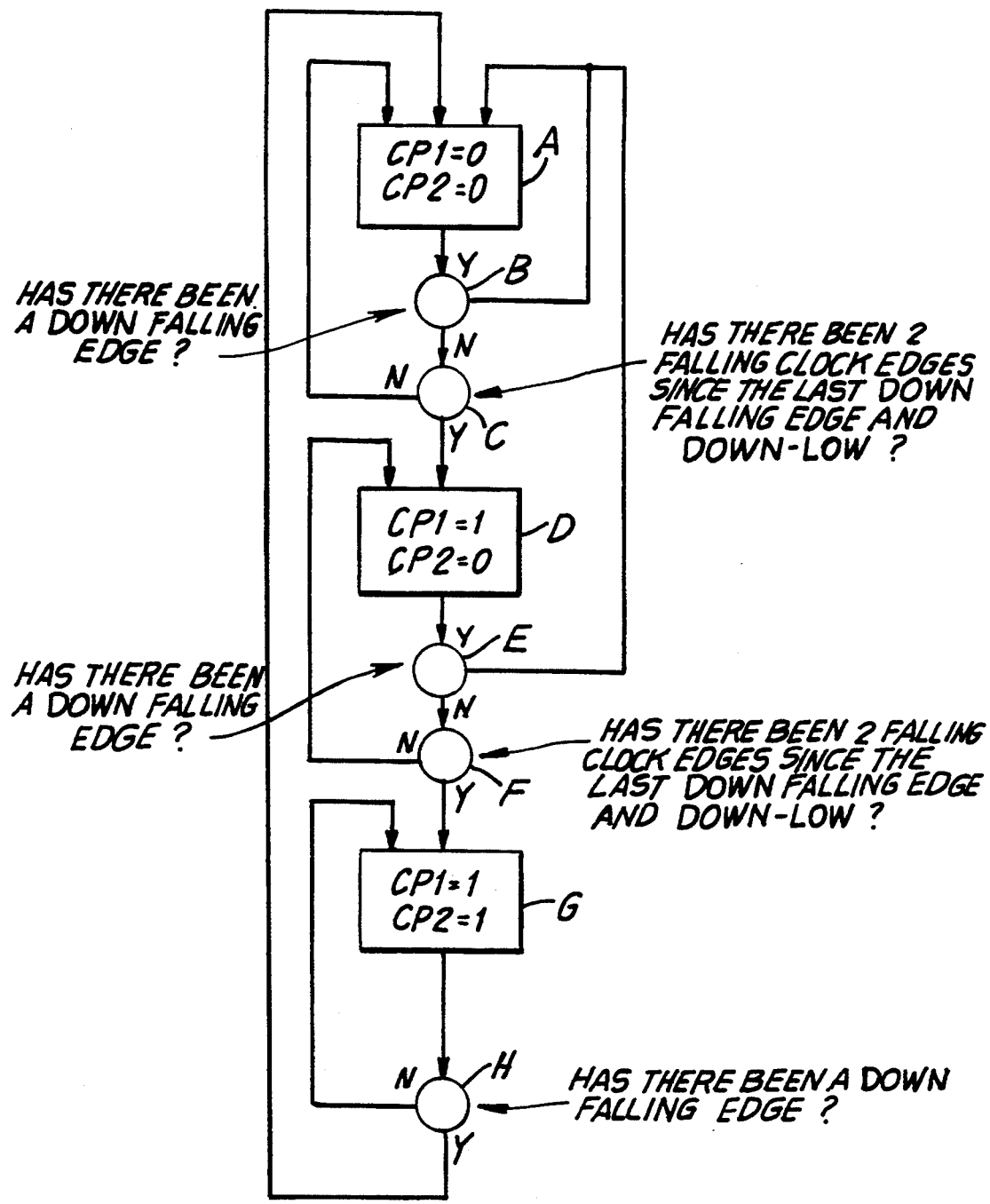
FIG. 5 is a flow chart illustrating the gain control process carried out by the gain control circuitry of the PLL clock recovery circuit of the present invention.
Figure 6:
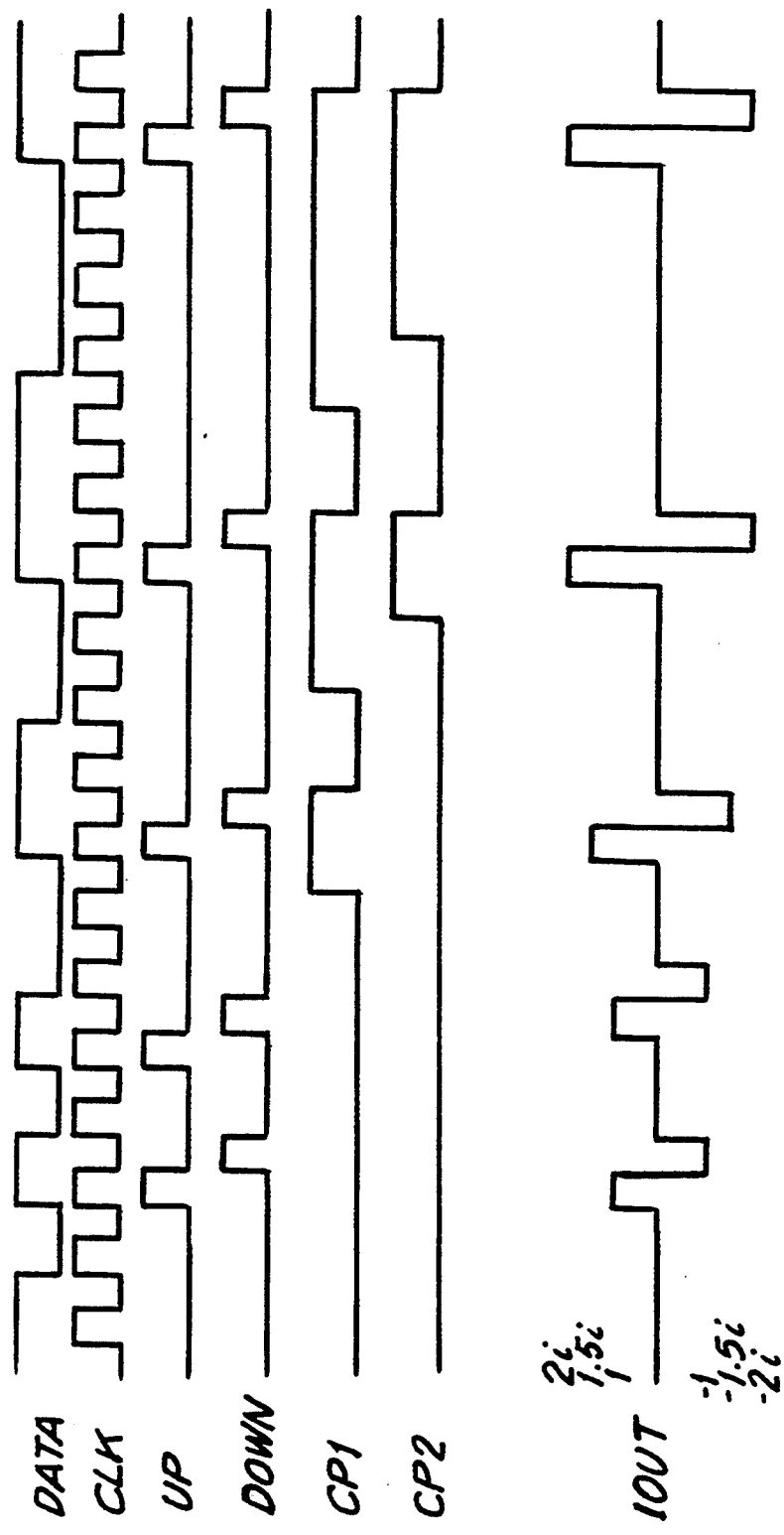
FIG. 6 is a timing diagram showing, for three exemplary data patterns, the relative timing of the various signals present within the PLL clock recovery circuit of the present invention.

Referring now to FIGS. 4 through 6, a detailed description of the present invention will now be provided. Significantly, the present invention provides an effective way in which both the accumated phase slope (APS) and the phase offset $\phi_{os}$ can be minimized while using a chain of an analog PLL clock recovery circuits in a token-ring network characterized by variable data pattern transmissions. In general, the present invention achieves these objectives by providing an analog PLL clock recovery circuit 20 having an open loop gain K which is substantially independent of the data density d of the variable data patterns transmitted over a local area network and presented to the PLL circuit. Other features of the present invention will be described in detail hereinafter.

As shown in FIG. 4, analog PLL clock recovery circuit 20 comprises an assembly of circuit components, namely: a phase detector 21; a variable-current charge pump 22; a loop filter 23; a voltage controlled oscillator (VCO) 24; and gain control circuitry 25. The function of phase detector 21 is to detect during each data cycle, the phase error that exists between each rising edge of the incoming digital data signal (DATA) and each rising edge of the recovered clock-signal (CLOCK), and in response thereto, sequentially produces first and second digital control pulse signals, which are indicated as UP and DOWN control pulse signals respectively. The pulse width of the UP control pulse during any particular data cycle is proportional to the degree of phase error detected during the corresponding data cycle. In contrast, the pulse width of the DOWN control pulse is substantially equal to one-half the clock cycle of the digital CLOCK signal recovered from the incoming digital DATA signal. As shown, in FIG. 4, the UP and DOWN control pulses are provided as input to the variable current charge pump.

In operation, phase detector 21 compares the relative timings of the rising edges of DATA and CLOCK signals. When the DATA signal undergoes a "low" to "high" transition, the UP control pulse signal is set "high". Thereafter, when the CLOCK signal undergoes a high to low transition, the UP control pulse signal is set low while the DOWN pulse signal is set high. At the next instance that the CLOCK signal undergoes a low to high transition, the DOWN control pulse signal is set low, and the output of the phase detector is left at its quiescent state (i.e. UP and DOWN control pulse signals are both low) until the phase detection cycle is repeated at the next rising edge of the digital DATA signal. As can be seen from the UP and DOWN control pulse signals produced from the phase detector during the exemplary process of FIG. 6, the UP pulse signal is always produced upon the occurrence of each rising edge of the digital DATA signal, and the DOWN control pulse signal is always produced upon the occurrence of the falling edge of an UP control pulse signal. Surprisingly, by operating the phase detector in this manner, better clock recovery performance is achieved under low jitter conditions.

The function of variable-current charge pump 22 is to produce a quantity of charge (IOUT) during each data cycle, which is proportional to the phase error (i.e. offset) detected by phase detector 21. As shown in FIG. 4B, variable current charge pump 22 comprises three independent stages of current sources and sinks, namely: a first current source 25A for providing a constant source of charge pump current i and a first current sink 25A for providing a constant sink for charge pump current $i$; a second current source 25B for providing a constant source of charge pump current $-0.5\ i$, and a second current sink 25B[1] for providing a constant sink for charge pump current $-0.5\ i$; and a third current source 25C' for providing a constant source of charge pump current $0.5\ i$, and a third current sink 25C' for providing a constant sink for charge pump current $-0.5\ i$. As shown, current source 25A and current sink 25A' are connected in series with a pair of electronically controlled current switches (e.g. current switching transistors) 26A and 26B, which are responsive to UP and DOWN control pulse signals, respectively. As shown, one end of output current line 27A is electrically connected between current switching transistors 26A and 26B and the other end thereof is connected to common output current line 28. This way, whenever an UP or DOWN control pulse signal is produced from phase detector 21, charge pump 22 produces either current i or −i. Current source 25B and current sink 25B' are connected in series with four electronically controlled current switches 26C through 26F, which are responsive to control pulse signals CP1, UP, DOWN and CP1, respectively. As shown, one end of output current line 27B is electrically connected between current switching transistor 26D and 26E, and the other end thereof is connected to common output line 28. Current source 25C and current sink 25C' are connected in series with electronically controlled current switches 26G through 26J, which are responsive to control pulse signals CP2, UP, DOWN and CP2, respectively. As shown, one end of output current line 27C is electrically connected between current switching transistors 26H and 26I, and the other end thereof is connected to common output line 28. Depending on the values of the control pulse signals UP, DOWN, CP1 and CP2, nine possible levels of charge pump current IOUT can be produced from charge pump circuit 22. The particular set of control signals associated with these variable amounts of charge pump current IOUT, are set forth in the Table of FIG. 4C.

As shown in FIG. 4, the output current IOUT from charge pump 21 is fed into loop filter 23 in order to smooth out current IOUT and thus compensate for the dynamics of the PLL circuit. As shown in FIG. 4D, loop filter 23 of the illustrative embodiment is implemented by a second order low-pass filter formed by a single resistive element R and a pair of capacitive elements C1 and C2, configured in a manner as shown. The analog voltage output (VOUT) generated across the low-pass filter 23 is provided as input to the voltage controlled oscillator 24. Voltage controlled oscillator, in turn, produces as output the recovered digital CLOCK signal, which has a frequency to proportional to voltage VOUT. In a typical token-ring network, the frequency of the clock signal is about 32.0 MHz, although it is understood that this value will vary from embodiment to embodiment. To form a closed loop PLL circuit, the recovered digital CLOCK signal is fed from the voltage controller oscillator into one input of phase detector 21 and into one input of gain control circuit 25.

As shown in FIG. 4, gain control circuitry 25 receives three input signals, namely: the digital DATA signal $D_1$; the DOWN control pulse signal from the output of the phase detector; and the recovered digital CLOCK signal. In response to the data pattern conditions sensed on the communication medium of the token-ring network, gain control circuitry 25 produces two control signals CP1 and CP2 which, as shown, are provided to charge pump 22 in order to control the current switches 26C, 26F, 26G and 26J. The amount of output current IOUT required to maintain the gain substantially constant independent of the data density d on the token-ring network, is controlled by predetermined combinations of signal level values for control pulses UP, DOWN, CP1 and CP2.

Figure 4A:
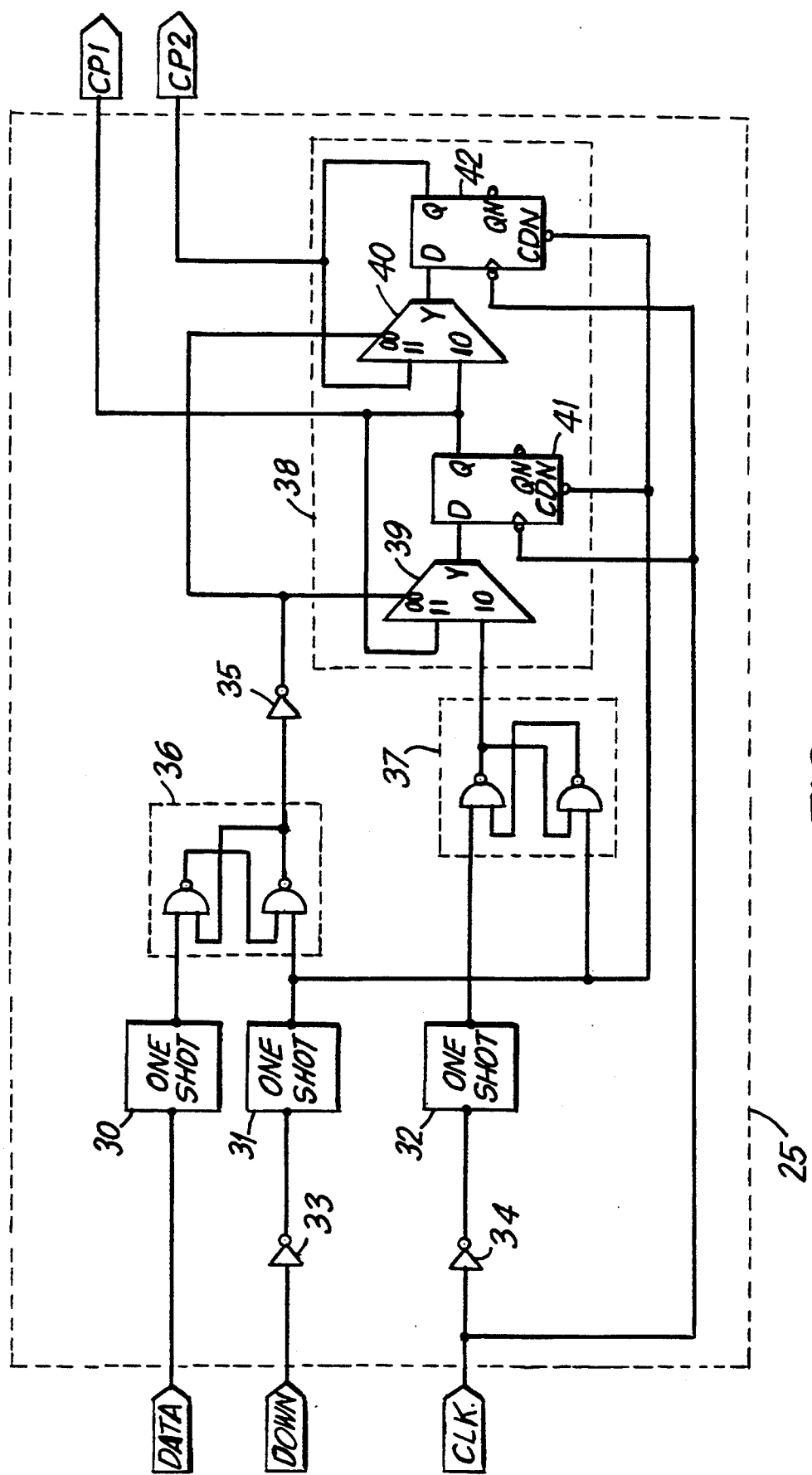
FIG. 4A is a schematic diagram of the gain control circuitry employed in the PLL clock recovery circuit of the illustrative embodiment of the present invention.
Figure 4D:
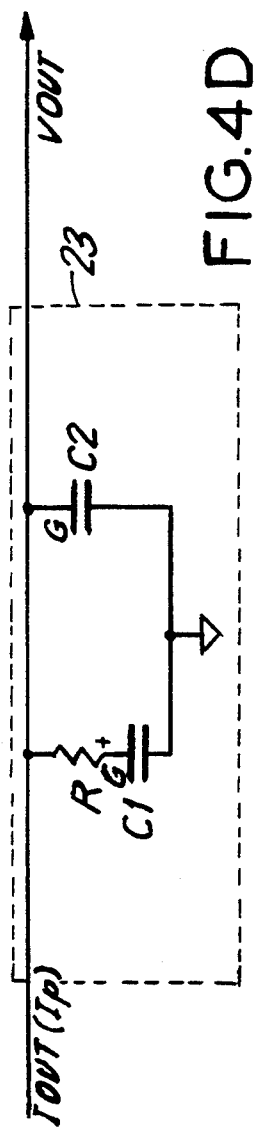
FIG. 4D is a schematic diagram of the loop filter employed in the PLL clock recovery circuit of the present invention.

As shown in FIG. 4A, the gain control circuit 25 of the illustrative embodiment is realized as an assembly of digital logic devices, namely: first, second and third one-shot (i.e. rising edge to pulse converter) circuits 30, 31 and 32, respectively; inverters 33, 34 and 35; first and second set/reset (S/R) latches 36 and 37; and a shift register 38 formed by a pair dual input multiplexers 39 and 40 and a pair of D-type flip-flop circuits 41 and 42, configured as shown. The configuration of gain control circuit 25 is described as follows. As shown in FIG. 4A, digital DATA signal is provided to the input of one-shot circuit 30, and the output of the one-shot circuit 30 in turn is provided to the first input of S/R latch 36. The output of S/R latch 36 is connected to the input of invertor 35, whereas the output of invertor 35 is connected to the control inputs (S) of multiplexers 39 and 40. As illustrated, the DOWN control pulse signal from the phase detector is connected to the input of one-shot circuit 31 by way of invertor 33, and the output of one-shot circuit 31 is connected to the other input of SR latch 36. The recovered digital CLOCK signal is connected to the trigger inputs of both D-type flip-flops 41 and 42, and also to the input of one-shot circuit 32 by way of invertor 34. The output of one-shot circuit 32, in turn, is connected to the first input of SR latch 37. The output of one-shot circuit 31 is also connected to the second input of SR latch 37, as well as to CDN pins of flip-flop circuits 41 and 42. The output of SR latch is connected to input IO of multiplexer 39, whereas the input I1 of multiplexer 40 is connected to both the output Q of flip flop circuit 41 and input IO of multiplexer IO and provides state variable (i.e. control signal) CP1. The output Y of multiplexer 39 is connected to the D input of flip-flop circuit 41, whereas the output Y of multiplexer 40 is connected to the D input of flip-flop circuit 42. Also, input I1 to multiplexer 40 is connected to output Q of flip-flop 42 and provides state variable CP2.

In essence, gain control circuitry 25 operates as a state machine, in which the control pulses CP1 and CP2 function as "state variables" which are precisely determined at any instant in time by tracking both past and present values of three input variables, namely: the digital DATA signal $D_1$, the DOWN control pulse signal and the recovered digital CLOCK signal. The gain control process performed by the state machinery of FIG. 4A, is schematically illustrated by the high level flow chart shown in FIG. 5. Notably, the purpose of this flow chart is to illustrate upon what conditions, gain control circuitry 25 produces the set of state variable {CP1, CP2} set forth in the two right most columns in the table of FIG. 4C.

As illustrated in FIG. 5, the gain control process begins at Block A by resetting both state variables CP1 and CP2 to zero (i.e. CPI=0, CP2=0). As indicated at Block B, the gain control circuit then determines whether the falling edge of a DOWN control pulse has been detected. If so, the gain control circuit returns to Block A and continues to produce CP1=0, CP2=0. If the falling edge of a DOWN control pulse is not detected, then the gain control circuit determines whether falling edges of two CLOCK pulses have been detected since the detection of the last falling edge of a DOWN control pulse, and the DOWN control pulse signal level was low. If so, then at Block D, the gain control circuit undergoes a state transition Block D and sets CPi=1 AND CP2=0. If the conditions at Block C are not detected, then the gain control circuit returns to Block A and resets control pulses CP1 and CP2 back to zero (i.e. CPi=0, CP2=0). At Block E, the gain control circuit again determines whether the falling edge of a DOWN pulse has been detected and if so, then at Block E the gain control circuit returns to Block A and sets CP1=0 and CP2=0. If the falling edge of a DOWN pulse is not detected at Block E, the gain control circuit determines at Block F whether the falling edges of three CLOCK pulses have been detected since the detection of the last falling edge of a DOWN pulse and the DOWN control pulse signal level was low. If this condition is not detected at Block F, then the gain control circuit returns to Block B and continues to set CP1=1 and CP2=0. However, if at Block F the specified condition is detected, then the gain control circuit undergoes a state transition at Block G and sets CP1=1 and CP2=1. Then at Block H, the gain control circuit determines whether the falling edge of a DOWN pulse has been detected. If not, then the gain control circuit returns to Block G and continues to produce CP1=1 and CP2=1. When at Block H the gain control circuit detects the falling edge of a DOWN pulse, the gain control circuit returns to Block A and resets CP1=0 and CP2=0. This control process is repeated indefinitely at an exceedingly high rate that enables tracking of phase error at the phase detector.

Referring to the timing signals of FIG. 6, the behavior of the gain control circuit is characterized for three different digital data patterns (i.e., one, two and three data cycle widths) which are most commonly transmitted in a token-ring network. As shown, the past and present history of the DATA signal, the DOWN control pulse signal and the recovered CLOCK signal fully characterize the operation of gain control circuitry 25 for the data patterns commonly transmitted over a token-ring communication network. Control pulse signals UP, DOWN, CP1 and CP2 fully characterize the operation of the charge pump circuit for these three data patterns.

During the operation of the PLL clock recovery circuit of the present invention, the phase detector detects (i.e. senses) the phase deviation between the DATA and CLOCK signal edges, while the gain control circuit keeps track of the data cycle widths (i.e. data density d) of the incoming digital DATA signal, on a data cycle by data cycle basis. Simultaneously, the variable current charge pump produces different amounts of current IOUT required during the transmission of different data patterns over the token-ring network, so as to maintain the open loop gain K substantially constant. When the clock frequency is 32.0 MHz and the data cycle width of the data is 93.75 ns, the charge pump current is 1.5 i. When the data cycle width of the incoming data is 125 ns or more, the charge pump current is 2 i.

Figure 2:
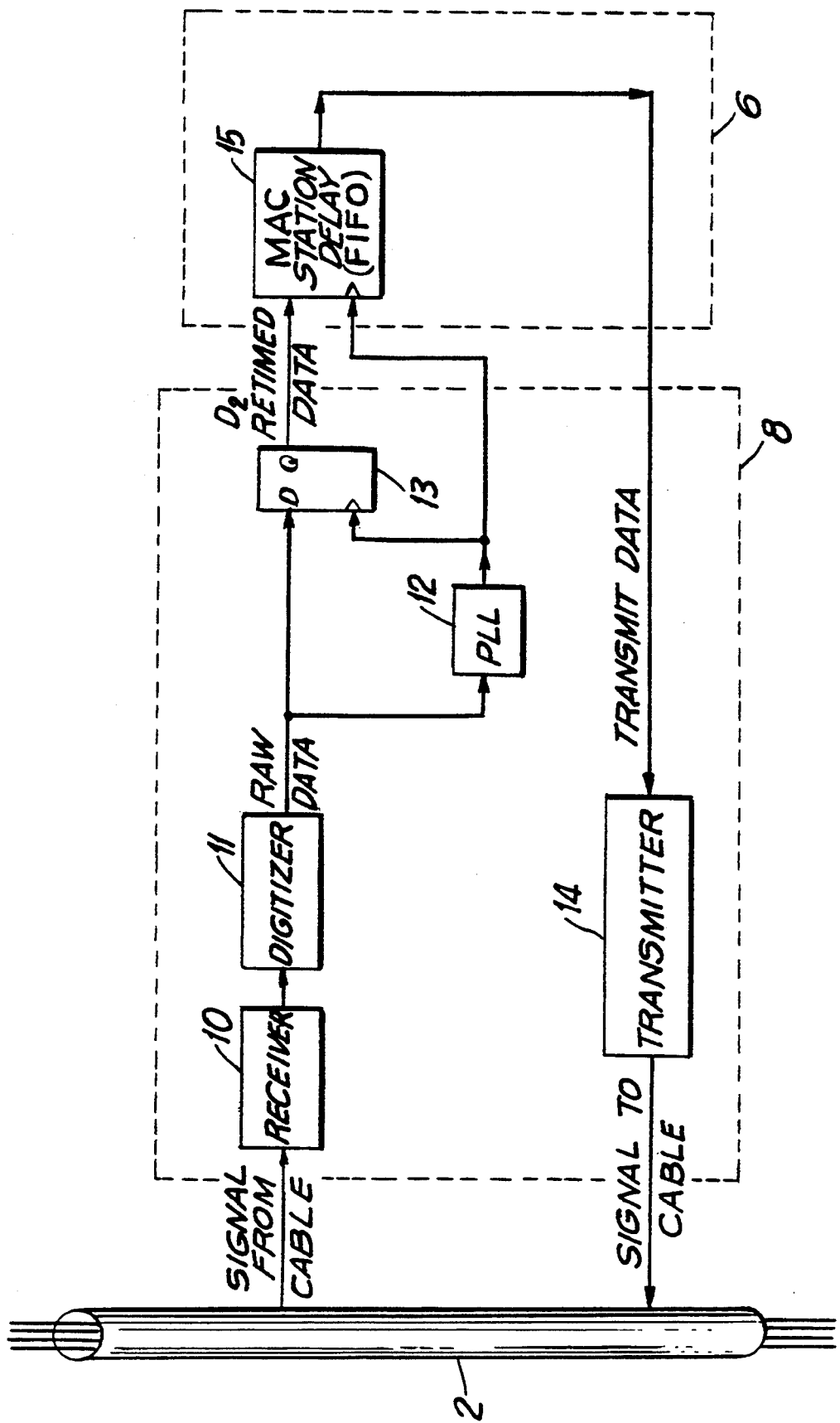
FIG. 2 is a block functional diagram of a data signal transceiver employed in the stations of a token-ring local area network.

In accordance with the present invention, the analog PLL clock recovery circuit of FIG. 4 is integrated in a VLSI chip populated with the circuit components of the token-ring transceiver shown in FIG. 2A. In turn, the VLSI token-ring transceiver chip of the present invention is interfaced with the high-speed VLSI data communication controller chip disclosed in copending application Ser. No. 07/965,145.

Figure 4E:
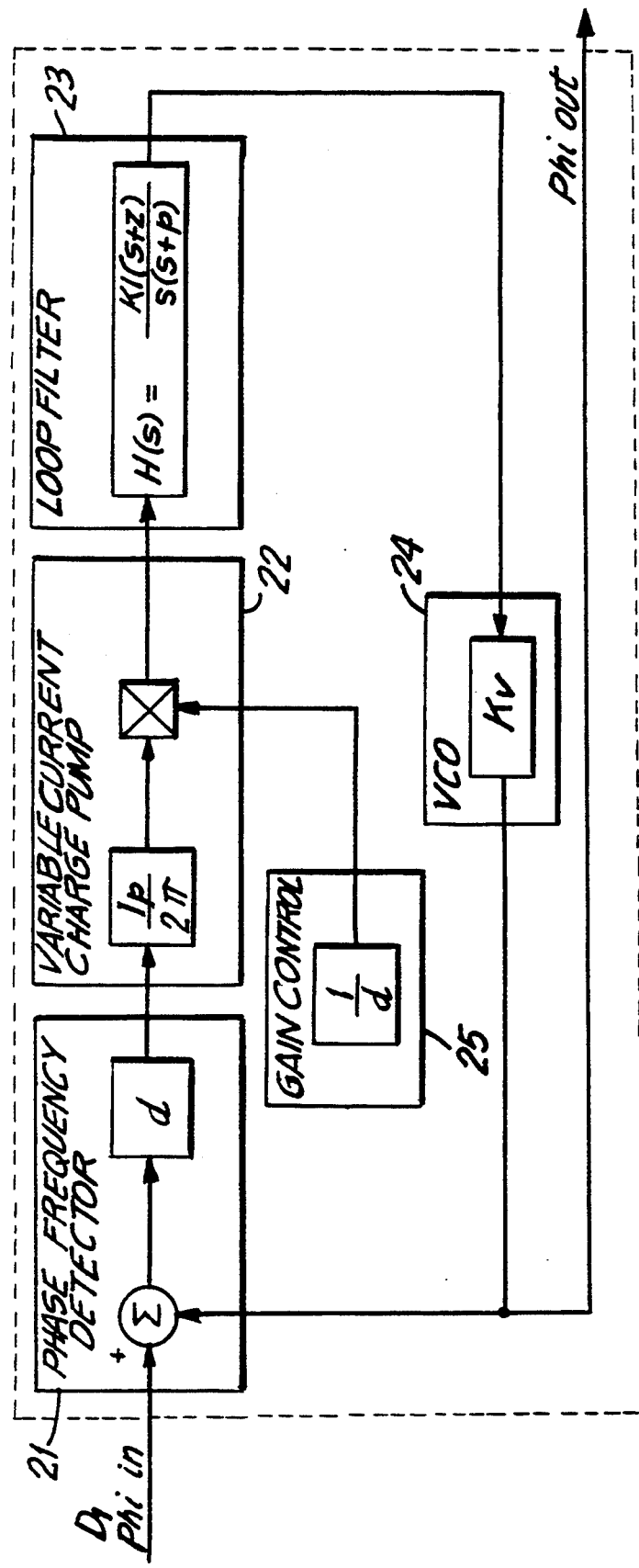
FIG. 4E is a transfer function of the PLL clock recovery circuit of the illustrative embodiment of the present invention.

From the foregoing description of the illustrative embodiment, it will be readily appreciated that controlling the gain of the PLL clock recovery circuit in the VLSI transceiver chip of the present invention, greatly improves the ability of the PLL to track data and accumulated phase slope over of the variable range of data cycle widths required for token-ring data recovery. As shown in the transfer function diagram of FIG. 4E, it is also apparent that by using the gain control circuitry of the present invention, the open loop gain for the PLL clock recovery circuit of the present invention is given by the expression:

$$K = \frac{1}{2\pi} K_v R \frac{I_p}{d} d = \frac{K_v I_p R}{2\pi} \quad (4)$$

Thus, the magnitude of the charge pump current $I_p$ is made inversely proportional to the data density d, on a data cycle by data cycle basis.

It will also be appreciated that modifications may be made to the embodiment of the present invention described hereinabove without necessarily departing from the scope and spirit of the present invention defined by the appended claims.

What is claimed is:

1. An analog PLL clock recovery circuit for recovering a digital clock signal from a digital data signal having pulse widths which may vary during each data cycle, said recovered digital clock signal having a first phase and said digital data signal having a second phase and the difference between said first phase and said second phase representing a phase error between said digital data signal and said recovered digital clock signal, said analog PLL clock recovery circuit comprising:
    phase detection means for detecting, during each said data cycle, the phase error between said digital data signal and said recovered digital clock signal, and producing first and second digital control pulse signals in response to the detection of said phase error;
    gain control means for producing, during each said data cycle, third and fourth digital control pulse signals, wherein the value of said third and fourth control pulse signals during each said data cycle depends on the value of said digital data signal, the value of said recovered clock signal, and the value of said second control pulse signal during said data cycle, and wherein the change in value of said third and fourth control pulse signals is responsive to the change in the value of said recovered digital clock signal;
    variable current charge pump operably associated with said phase detection means to receive said first and second digital control pulse signals, and automatically producing during each said data cycle a first amount of current in response to the production of either one of said first and second digital control pulse signals, and a second amount of current in response to the production of said first, second, third and fourth control pulse signals;
    a loop filter for producing during each said data cycle, a control signal corresponding to the amount of current produced from said variable current charge pump during each said data cycle; and
    a variable frequency oscillator for producing said recovered digital clock signal having a clock frequency which is proportional to said produced control signal.

2. The analog PLL clock recovery circuit of claim 1, wherein the pulse width of said first control pulse signal during said data cycle is proportional to the phase-error detected during said data cycle, and
    said pulse width of said second control pulse signal during said data cycle being substantially equal to one-half of the pulse width of the clock cycle of said recovered digital clock signal.

3. The analog PLL clock recovery circuit of claim 2, wherein said second control pulse signal is produced sequentially after said first control pulse signal has been produced during each said data cycle.

4. The analog PLL clock recovery circuit of claim 1, wherein said variable frequency oscillator comprises a voltage controlled oscillator.

5. The analog PLL clock recovery circuit of claim 1, wherein said first amount of current is produced by a first current source, and said second amount of current is produced from a second current source.

6. The analog PLL clock recovery circuit of claim 1, wherein said gain control means comprises:
- a first D-latch circuit having a Q-output terminal producing said third digital control pulse signal and having a C-input responsive to the falling edge of said recovered digital clock signal;
- a second D-latch circuit having a Q-output terminal producing said fourth digital control pulse signal and having a C-input responsive to the falling edge of said recovered digital clock signal;
- said first and second D-latch circuit having R-inputs responsive to the falling edge of second digital control pulse signal;
- first and second switch means each having a control input responsive to said digital data signal and said second control signal, and having two signal inputs and one signal output respectively;
- said first and second D-latch circuit having D-inputs connected to the signal output of said first and second switch means respectively;
- a first SR-latch means having an S-input responsive to the falling edge of said recovered digital clock signal and having an R-input responsive to the falling edge of said second digital control pulse signal and having a Q-output producing a fifth control pulse signal, said fifth signal connected to said first signal input of said first switch means;
- a fifth control pulse signal having a high level after the falling edge of said recovered digital clock signal and having a low level after the falling edge of said second digital control pulse signal, said fifth signal connected to said first signal input of said first switch means;
- a circuit connection from said third control signal to said second signal input of said first switch means and to said first signal input of said second switch means; and
- a circuit connection from said fourth control signal to said second signal input of said second switch means.

7. A transceiver for transmitting and receiving analog data signals over the communication medium of a communication network, said transceiver comprising:
- signal receiving means for receiving a first analog signal on the communication medium of said communication network;
- signal converting means for converting said first analog data signal into a digital data signal;
- an analog PLL clock recovery circuit for recovering a digital clock signal from a digital data signal having pulse widths which may vary during each data cycle, said recovered digital clock signal having a first phase and said digital data signal having a second phase and the difference between said first phase and said second phase representing a phase error between said digital data signal and said recovered digital clock signal, said analog PLL clock recovery circuit including;
- phase detection means for detecting, during each said data cycle, the phase error between said digital data signal and said recovered digital clock signal, and producing first and second digital control pulse signals in response to the detection of said phase error,
- gain control means for producing, during each said data cycle, third and fourth digital control pulse signals, wherein the value of said third and fourth control pulse signals during each said data cycle depends on the value of said digital data signal, the value of said recovered clock signal, and the value of said second digital control pulse signal during said data cycle, and wherein the change in value of said third and fourth control pulse signals is responsive to the change in the value of said recovered digital clock signal,
- variable current charge pump operably associated with said phase detection means to receive said first and second digital control pulse signals, and automatically producing during each said data cycle a first amount of current in response to the production of either one of said first and second digital control pulse signals, and a second amount of current in response to the production of said first, second, third and fourth control pulse signals having a predetermined combination of signal values,
- a loop filter for producing during each said data cycle, a control signal in response to the amount of current produced from said variable current charge pump, and
- a variable frequency oscillator for producing said recovered digital clock signal having a clock frequency which is proportional to said produced control signal;
- data acquisition means for acquiring raw data from said digital data signal using said recovered digital clock signal;
- signal producing means for producing a second analog data signal using said raw data and said recovered digital clock signal; and
- signal transmitting means for transmitting said second analog data signal over the communication medium of said communication network.

8. The transceiver of claim 7, wherein the pulse width of said first control pulse signal during said data cycle is proportional to the phase-error detected during said data cycle,
and the width of said second control pulse signal during said data cycle is substantially equal to one-half of the pulse width of the clock cycle of said recovered digital clock cycle.

9. The transceiver of claim 8, wherein said second control pulse signal is produced sequentially after said first control pulse signal has been produced during each said data cycle.

10. The transceiver of claim 7, wherein said variable frequency oscillator comprises a voltage controlled oscillator.

11. The transceiver of claim 7, wherein said first amount of current is produced by a first current source, and said second amount of current is produced from a second current source.

12. The analog PLL clock recovery circuit of claim 7, wherein said gain control means comprises a first D-latch circuit having a Q-output terminal producing said third digital control pulse signal and having a C-input responsive to the falling edge of said recovered digital clock signal;

a second D-latch circuit having a Q-output terminal producing said fourth digital control pulse signal and having a C input responsive to the falling edge of said recovered digital clock signal;

said first and second D-latch circuit having R-inputs responsive to the falling edge of second digital control pulse signal;

first and second switch means each having a control input responsive to said digital data signal and said second control signal, and having two signal inputs and one signal output respectively;

said first and second D-latch circuit having D-inputs connected to the signal output of said first and second switch means respectively;

a first SR-latch means having an S-input responsive to the falling edge of said recovered digital clock signal and having an R-input responsive to the falling edge of said second digital control pulse signal and having a Q-output producing a fifth control pulse signal, said fifth signal connected to said first signal input of said first switch means;

a fifth control pulse signal having a high level after the falling edge of said recovered digital clock signal and having a low level after the falling edge of said second digital control pulse signal, said fifth signal connected to said first signal input of said first switch means;

a circuit connection from said third control signal to said second signal input of said first switch means and to said first signal input of said second switch means; and a circuit connection from said fourth control signal to said second signal input of said second switch means.

* * * * *